United States Patent
Jo et al.

(10) Patent No.: US 8,470,914 B2
(45) Date of Patent: Jun. 25, 2013

(54) PHOTOSENSITIVE POLYIMIDE AND PHOTOSENSITIVE RESIN COMPOSITION COMPRISING THE SAME

(75) Inventors: Jung Ho Jo, Daejeon (KR); Kyung Jun Kim, Daejeon (KR); Hye Ran Seong, Daejeon (KR); Hye Won Jeong, Daejeon (KR); Chan Hyo Park, Daejeon (KR); Yu Na Kim, Daejeon (KR); Sang Woo Kim, Daejeon (KR); Se Jin Shin, Daejeon (KR); Kyoung Ho Ahn, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/861,761

(22) Filed: Aug. 23, 2010

(65) Prior Publication Data
US 2011/0046277 A1  Feb. 24, 2011

Related U.S. Application Data

(63) Continuation of application No. PCT/KR2010/004614, filed on Jul. 15, 2010.

(30) Foreign Application Priority Data

Jul. 15, 2009 (KR) .................. 10-2009-0064604
Aug. 7, 2009 (KR) .................. 10-2009-0073017

(51) Int. Cl.
  *C08L 79/08* (2006.01)
  *C08G 69/26* (2006.01)
  *C08K 5/41* (2006.01)

(52) U.S. Cl.
  USPC .......................... 524/107; 528/184

(58) Field of Classification Search
  USPC .......................... 524/107; 528/184
  See application file for complete search history.

(56) References Cited

U.S. PATENT DOCUMENTS

| 4,778,859 A | 10/1988 | Ai et al. |
| 4,925,912 A * | 5/1990 | Rohde et al. .................. 528/226 |
| 5,288,588 A | 2/1994 | Yukawa et al. |
| 7,189,488 B2 | 3/2007 | Yamanaka et al. |
| 2004/0197699 A1 | 10/2004 | Nakayama et al. |
| 2010/0069520 A1* | 3/2010 | Kim et al. .................. 522/36 |
| 2010/0084171 A1* | 4/2010 | Fujihara et al. .................. 174/258 |

FOREIGN PATENT DOCUMENTS

| TW | 200300772 A | 6/2003 |
| TW | 567198 | 12/2003 |
| TW | I306881 B | 3/2009 |
| WO | 2008/078620 A1 | 7/2008 |
| WO | 2008/132960 A1 | 11/2008 |
| WO | 2009/145065 A1 | 12/2009 |

OTHER PUBLICATIONS

Taiwanese Office Action issued in Taiwanese Patent Appln. No. 099123403 on Mar. 20, 2013 along with English translation, 7 pages.

* cited by examiner

*Primary Examiner* — John Uselding
(74) *Attorney, Agent, or Firm* — Rothwell, Figg, Ernst & Manbeck, P.C.

(57) ABSTRACT

The present invention relates to polyimide or precursor thereof represented by Chemical Formula 1 or 2 and a photosensitive resin composition including the same. The polyimide or precursor thereof are fabricated using diamine comprising polyalkyleneoxide. The photosensitive resin composition of the present invention has excellent light transmissivity, an excellent resolution, and excellent photo sensitivity and image forming performance. Further, the photosensitive resin composition has high adhesiveness with substrates, such as a silicon film, a silicon oxide film, and a metal film. In particular, an excellent film without failure, such as crack, can be formed.

10 Claims, No Drawings

PHOTOSENSITIVE POLYIMIDE AND PHOTOSENSITIVE RESIN COMPOSITION COMPRISING THE SAME

CROSS REFERENCE TO RELATED APPLICATION

The present application claims priority to International Application PCT/KR2010/004614, with an International Filing Date of Jul. 15, 2010, which claims the benefit of Korean patent application no. 10-2009-0064604 filed in the Korea Intellectual Property Office on Jul. 15, 2009, and Korean patent application no. 10-2009-0073017 filed in the Korea Intellectual Property Office on Aug. 7, 2009, the entire contents of which are incorporated herein by reference.

TECHNICAL FIELD

The present invention relates to photosensitive polyimide useful for protecting a surface of a protection film or an insulating film in a semiconductor device, or a surface of an insulating film in an OLED display, and a photosensitive resin composition comprising the photosensitive polyimide.

BACKGROUND OF THE INVENTION

Polyimide is a polymer having two imide rings in the backbone and fabricated by condensation-polymerization of tetracarboxyl acid and diamine.

Polyimide is of commercial importance because it has excellent light transmissivity, excellent mechanical properties, excellent thermal characteristics, and an excellent adhesive strength with a substrate. Polyimide is widely used in the various fields, such as electricity, electron, cars, airplanes, and semiconductors, instead of metal and glass.

In particular, polyimide is used for a surface protection film or an insulating film of a semiconductor device because of its excellent thermal characteristics and mechanical properties. Most polyimide has a low solubility and thus polyimide is chiefly fabricated using a method comprising obtaining a polyimide precursor solution, coating the polyimide precursor solution on a substrate made of glass, etc., and performing curing using heat treatment. Commercialized polyimide products are supplied in the form of a polyimide precursor solution or a polyimide film. In the field of semiconductor devices, the polyimide products are chiefly supplied in the form of a polyimide precursor solution.

A photosensitive polyimide composition is required to have photo sensitivity and must not cause a crack in a protection film so that it can bear up against a device manufacturing process such as a semiconductor manufacturing process. To this end, it is important to select a synthesis monomer for fabricating a polyimide precursor having excellent light transmissivity and resolution, but not causing a crack in the final device manufacturing process.

BRIEF SUMMARY OF THE INVENTION

One embodiment of the present invention is to provide polyimide with excellent light transmissivity and photo sensitivity, or a precursor thereof.

Another embodiment of the present invention is to provide a photosensitive polyimide resin composition comprising the polyimide or precursor thereof as a binder resin, which has high adhesiveness with a substrate and an excellent film characteristic without a crack.

DETAILED DESCRIPTION OF THE INVENTION

According to the present invention, when a polyimide or precursor thereof is fabricated, a photoactive compound is added to polyimide fabricated using diamine that contains polyalkyleneoxide, as a synthesis monomer, or to a precursor thereof. Accordingly, a photosensitive polyimide resin composition which can form a polyimide pattern with excellent light transmissivity and photosensitivity and without a crack and has excellent adhesiveness with a substrate, can be fabricated.

More particularly, the present invention provides a polyimide or precursor represented by Chemical Formula 1 or 2 below:

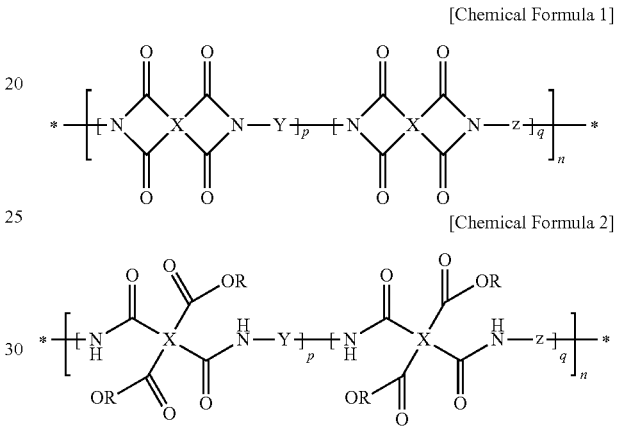

In the chemical formulas 1 and 2,

X is a 4-valence organic group,

Y is a 2-valence organic group, $0 \leq p < 1$, $0 < q \leq 1$, and $p+q=1$, n is an integer of 2 to 500, R is hydrogen or an alkyl group having 1 to 8 carbon atoms, and Z is derived from a diamine chemical compound represented by Chemical Formula 3 below.

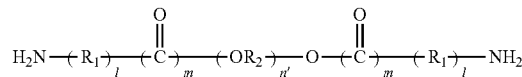

wherein R1 is alkylene or arylene having 2 to 8 carbon atoms, l is 0 or 1, m is 0 or 1, R2 is alkylene having 2 to 8 carbon atoms, and n' is an integer of 1 to 21.

In the chemical formula 3, n' can be an integer of 2 to 15.

The substituent X in the chemical formula 1 can be at least one organic group selected from the group consisting of:

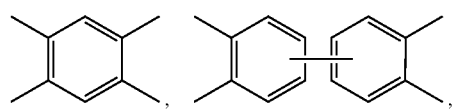

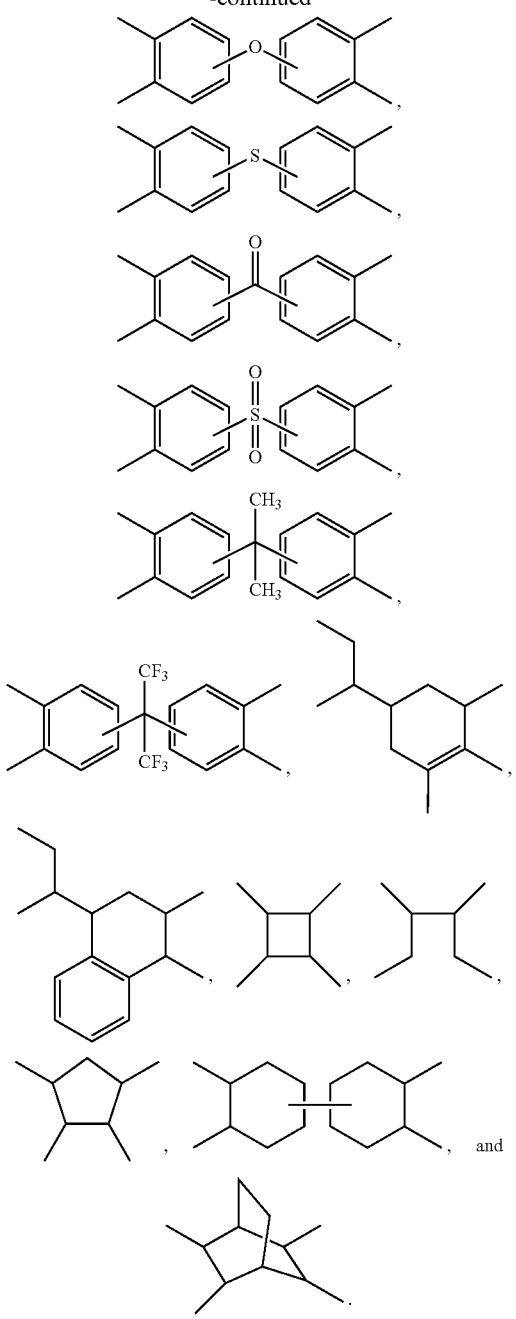
The substituent Y in the chemical formula 1 can be at least one organic group selected from the group consisting of:
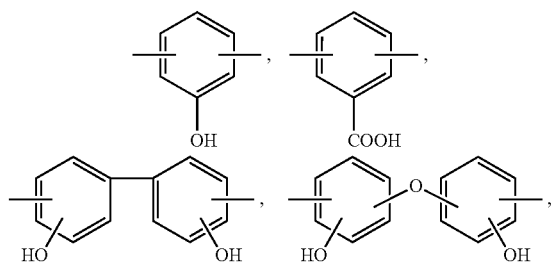
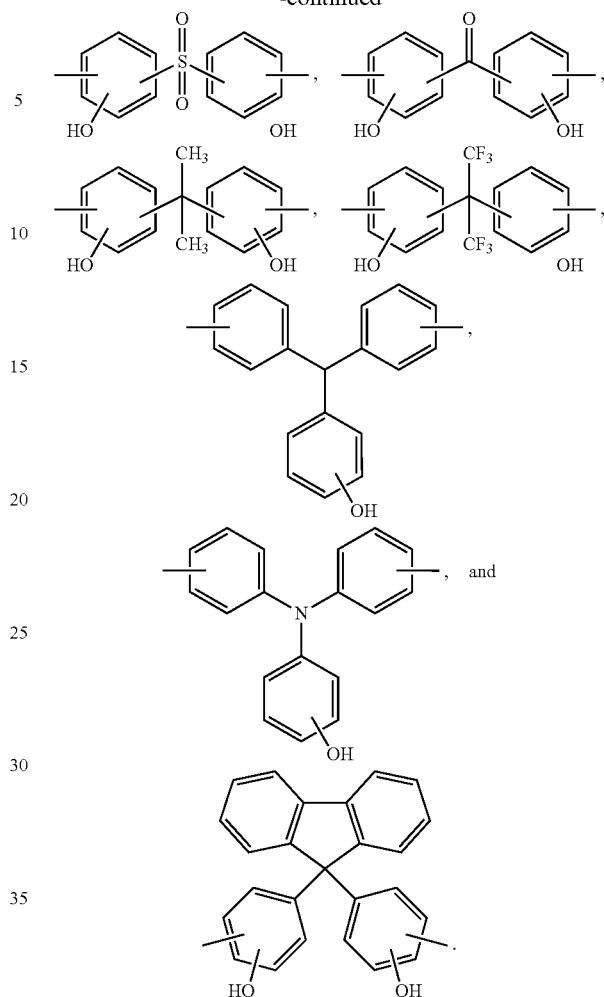
The substituent Y in the Chemical Formula 1 can be an organic group derived from at least one organic compound selected from the group consisting of:
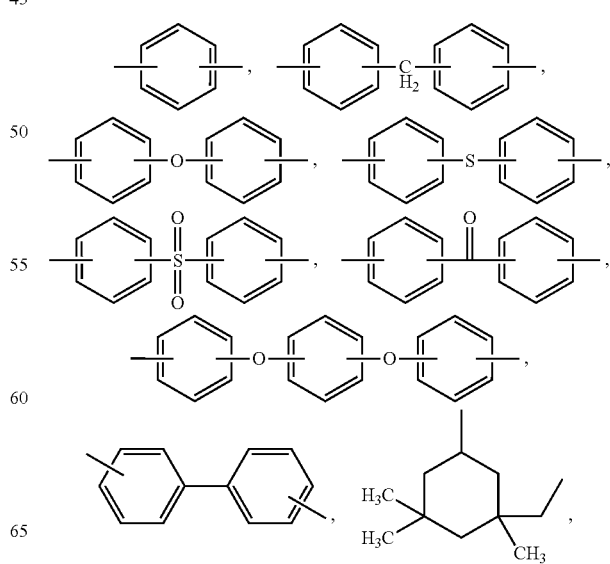

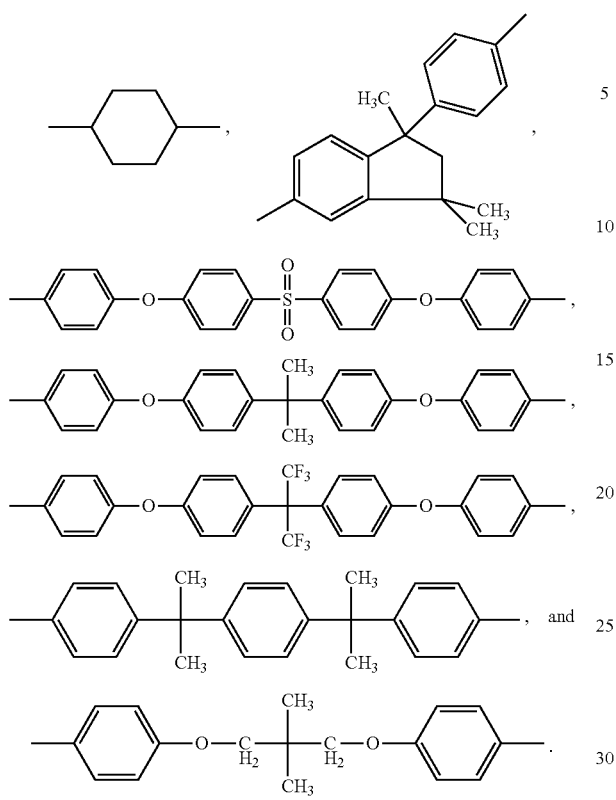

Further, the present invention provides a photosensitive resin composition comprising the polyimide or precursor and a photoactive compound. 1 to 50 parts by weight of the photoactive compound is contained in the composition for every 100 parts by weight of the polyimide or precursor thereof.

The photoactive compound can be at least one chemical compound selected from the group consisting of:

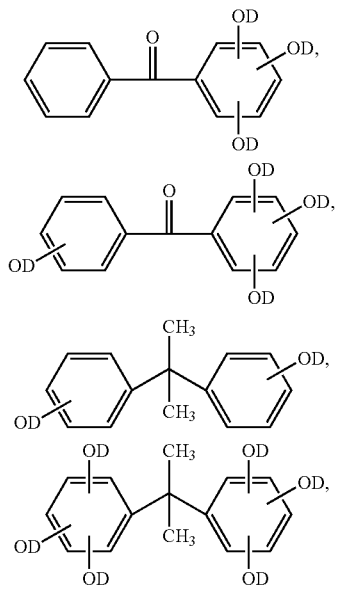

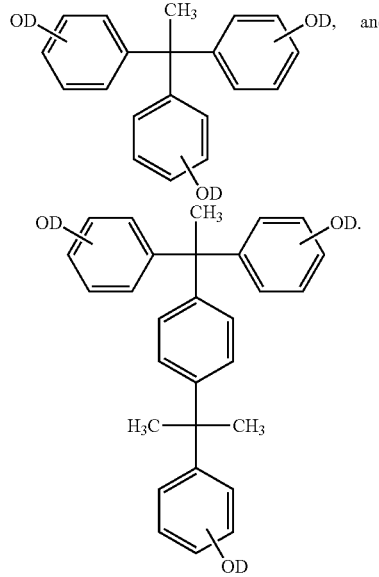

wherein, D is at least one organic group selected from the group consisting of:

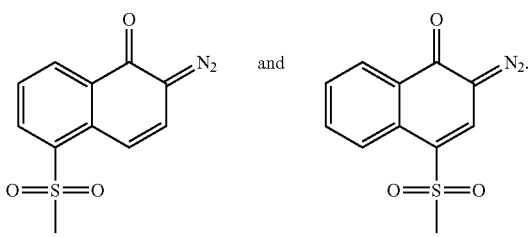

The photosensitive resin composition can further include 0.1 to 30 parts by weight of one or more additives such as a dissolution rate regulator, a promoter, an adhesive enhancer, and a surface active agent, for every 100 parts by weight of the polyimide or precursor thereof.

It is preferred that 40 to 97 parts by weight of a dissolvent of one or more kinds selected from a group, comprising N-methyl-2-pyrrolidone, N,N-dimethylformamide, N,N-dimethylacetamide, dimethylsulphoxide, N,N-diethylacetamide, γ-butyrolactoneketone, γ-valerolactoneketone, m-cresol, ethyleneglycol monomethylether, ethyleneglycol monomethylether acetate, ethyleneglycol monoethylether, ethyleneglycol monoethylether acetate, ethyleneglycol monobutylether, ethyleneglycol monobutylether acetate, propyleneglycol monomethylether, propyleneglycol monomethylether acetate, propyleneglycol monoethylether, propyleneglycol monoethylether acetate, propyleneglycol monopropylether, propyleneglycol monopropylether acetate, propyleneglycol monobutylether, propyleneglycol monobutylether acetate, propyleneglycol dimethylether, propyleneglycol diethylether, propyleneglycol dipropyltether, propyleneglycol dibutylether, lactic acid ethyl, lactic acid butyl, cyclohezanones, and cyclopentanone, be included for every 100 parts by weight of the photosensitive resin composition.

A photosensitive resin composition comprising the polyimide or precursor thereof according to the present invention does not generate a crack in a final device manufacturing process and has significantly improved film characteristics, such as tension strength, as compared to a photosensitive resin composition using the existing polyimide as a binder resin.

The present invention relates to a polyimide or precursor thereof; and a photosensitive resin composition comprising the polyimide or precursor thereof.

The photosensitive resin composition of the present invention is composed of polyimide fabricated using diamine containing polyalkyleneoxide as a synthesis monomer, or a precursor thereof and a photoactive compound capable of generating acid in response to light. The photosensitive resin composition can be fabricated by adding an adhesive enhancer or a surface active agent thereto, if appropriate.

In the present invention, the polyimide or precursor used as a base resin is a polymer represented by Chemical Formula 1 or 2 below:

[Chemical Formula 1]
[Chemical Formula 2]

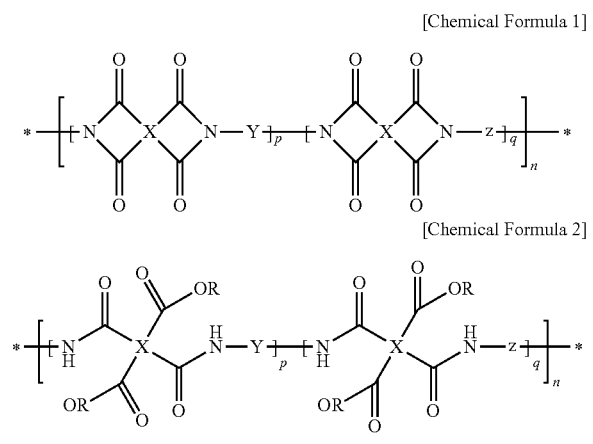

In Chemical Formulas 1 and 2, X is a 4-valence organic group;

Y is a 2-valence organic group;

$0 \leq p < 1$, $0 < q \leq 1$, and $p+q=1$, n is an integer of 2 to 500,

R is hydrogen or an alkyl group having 1 to 8 carbon atoms, and

Z is derived from a diamine chemical compound represented by Chemical Formula 3 below.

Chemical Formula 3

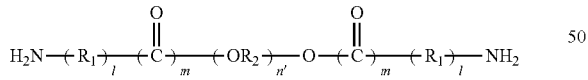

wherein R1 is alkylene or arylene having 2 to 8 carbon atoms, l is 0 or 1, m is 0 or 1, R2 is alkylene having 2 to 8 carbon atoms, and n' is an integer of 1 to 21.

The polyimide or precursor thereof having a repetition unit of Chemical Formula 1 or 2, is fabricated through the reaction of diamine and tetracarboxyl dianhydride (i.e., an acid component) using an organic solvent.

In the present invention, a diamine chemical compound contains polyalkyleneoxide (—OR$_2$). In the polyalkyleneoxide, R$_2$ can be an alkylene group having a carbon number of 2 to 8. The polyimide or precursor thereof containing the substituent Z has the film characteristics of a photosensitive resin composition (in particular, an effect of preventing a crack in a film).

When polyimide polymers containing an alkyleneoxide structure as diamine are fabricated according to the present invention, the degree of freedom of polyimide main chains having the stiff and rigid structure can be increased. If the degree of freedom of the polyimide chains is increased, a structure in which the polymer chains are well entangled is produced, thereby improving elongation. Typically, in the case in which polyimide polymers are used as the binder resin of a PR composition, an impact resulting from external heat, etc. is applied. Here, if elongation is too small, the polymer chains are broken, resulting in a deteriorated film characteristic. Accordingly, in the present invention, the alkyleneoxide structure is included in the polyimide polymers in order to solve the conventional problem. Accordingly, there is an advantage in that the characteristic of a film made of a PR composition can be improved.

In the polyimide or precursor thereof represented by Chemical Formula 1, the substituent X is a 4-valence organic group derived from tetracarboxyl dianhydride and can be at least one selected from the group consisting of:

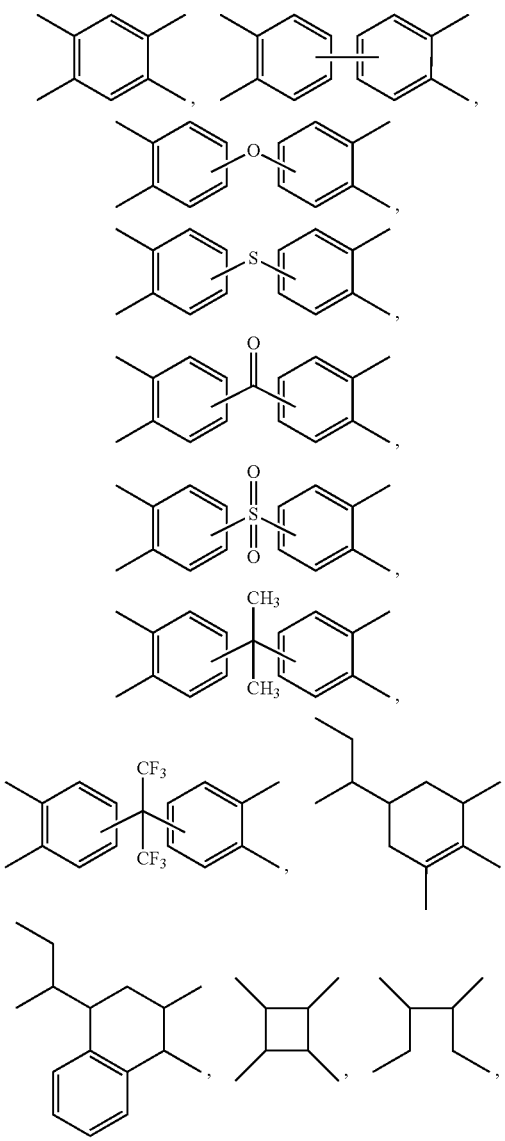

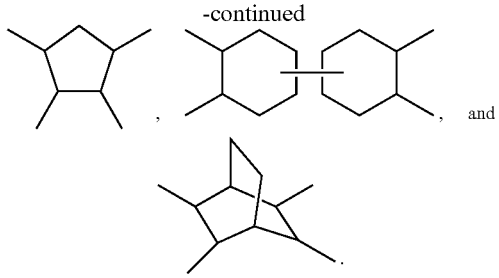, and

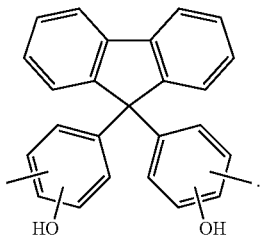.

The polyimide or precursor thereof represented by Chemical Formula 1 of the present invention can contain one or more of the 4-valence organic group as the substituent X.

In the present invention, when the polyimide or precursor thereof is fabricated, tetracarboxyl dianhydride containing the 4-valence organic group is subjected to condensation polymerization with diamine represented by Chemical Formula 2.

Furthermore, in the present invention, in order to give photosensitivity to the polyimide or precursor thereof, the polyimide or precursor thereof is fabricated using diamine comprising a 2-valence organic group selected from the group consisting of:

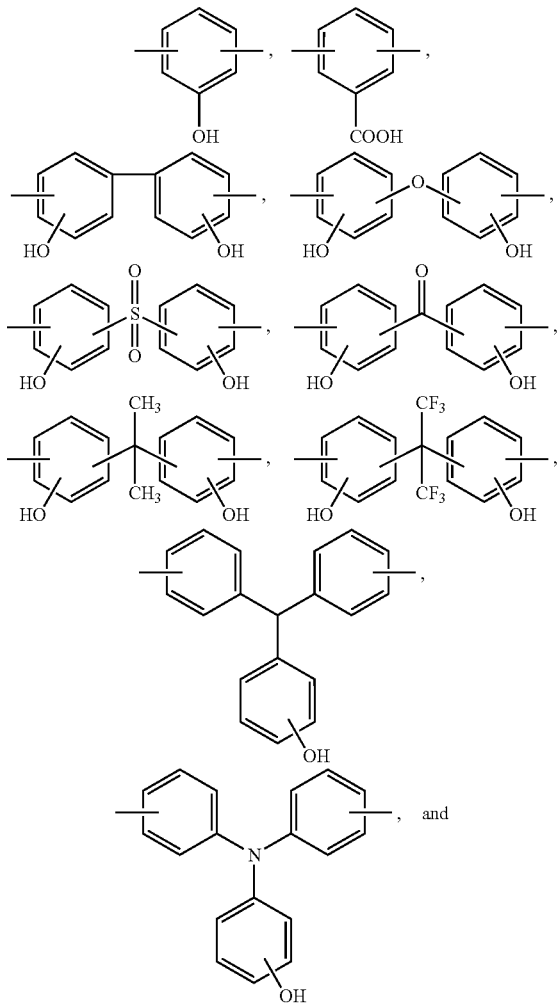

as a synthesis monomer in addition to diamine represented by Chemical Formula 2.

The 2-valence organic group comprises a phenol oxalic acid radical or a carboxyl radical, thus giving alkali solubility to the polyimide or precursor thereof of the present invention.

Furthermore, in the present invention, in order to control the photosensitivity of the polyimide or precursor thereof, a diamine chemical compound comprising a 2-valance organic group selected from the group consisting of:

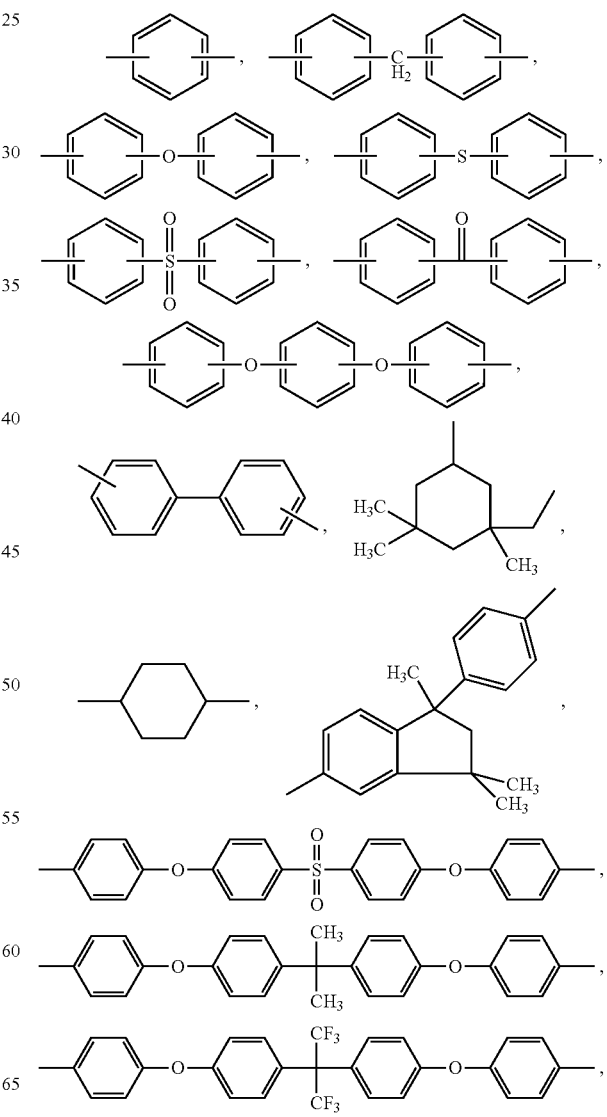

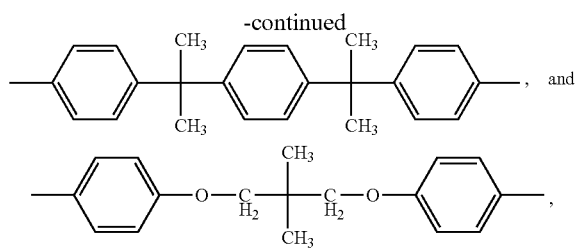

can be used as a synthesis monomer.

In the polyimide or precursor thereof represented by Chemical Formula 1 of the present invention, the substituent Y can be one or two or more of the 2-valence organic groups as depicted above.

In the present invention, the polyimide or precursor thereof can have a weight average molecular weight of 2,000 to 50,000. If the weight average molecular weight is too low, there is a problem in that a film characteristic becomes poor. If the weight average molecular weight is too high, there is a problem in that solubility in a developer is reduced.

The polyimide or precursor thereof of the present invention is fabricated through the reaction of tetracarboxyl dianhydride and the diamine chemical compound represented by Chemical Formula 2 under an organic solvent.

In the present invention, the organic solvent used to fabricate the polyimide or precursor thereof can include N-methyl-2-pyrrolidone, N,N-dimethylformamide, N,N-dimethylacetamide, dimethylsulphoxide, N,N-diethylacetamide, γ-butyrolactoneketone, γ-valerolactoneketone, m-cresol, and so on.

The photosensitive polyimide resin composition of the present invention is fabricated by adding a photoactive compound (PAC) to the polyimide or precursor thereof fabricated as described above, and adding a dissolution rate regulator, a promoter, an adhesive enhancer, or a surface active agent, if appropriate. 0.1 to 30 parts by weight of each of the additives can be used for every 100 parts by weight of the polyimide or precursor thereof.

The following compounds can be used as the photoactive compound in the present invention.

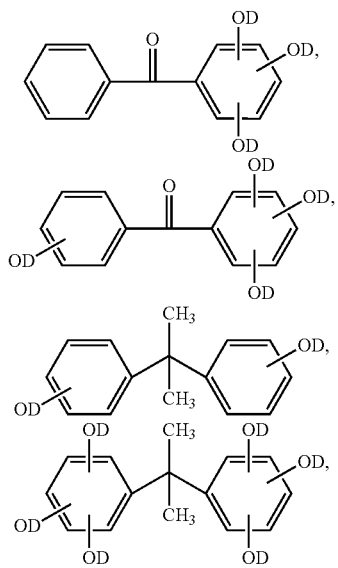

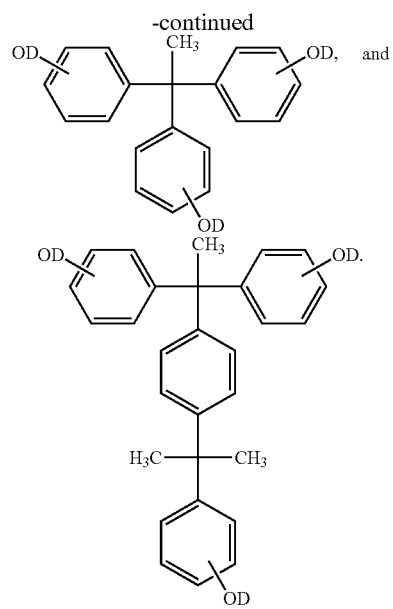

wherein D is one of the following compounds:

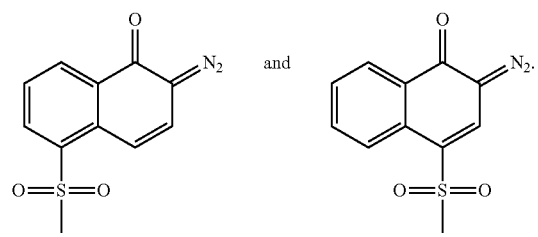

It is preferred that 1 to 50 parts by weight of the photoactive compound be used for every 100 parts by weight of the polyimide or precursor thereof.

Furthermore, a dissolvent used in the photosensitive resin composition of the present invention is not specially limited to any one as long as it can dissolve the polyimide or precursor thereof. The dissolvent can be, for example, at least one selected from the group consisting of N-methyl-2-pyrrolidone, N,N-dimethylformamide, N,N-dimethylacetamide, dimethylsulphoxide, N,N-diethylacetamide, γ-butyrolactoneketone, γ-valerolactoneketone, m-cresol, ethyleneglycol monomethylether, ethyleneglycol monomethylether acetate, ethyleneglycol monoethylether, ethyleneglycol monoethylether acetate, ethyleneglycol monobutylether, ethyleneglycol monobutylether acetate, propyleneglycol monomethylether, propyleneglycol monomethylether acetate, propyleneglycol monoethylether, propyleneglycol monoethylether acetate, propyleneglycol monopropylether, propyleneglycol monopropylether acetate, propyleneglycol monobutylether, propyleneglycol monobutylether acetate, propyleneglycol dimethylether, propyleneglycol diethylether, propyleneglycol dipropyltylether, propyleneglycol dibutylether, lactic acid ethyl, lactic acid butyl, cyclohezanones, and cyclopentanone.

It is preferred that 40-97 parts by weight of the dissolvent is used for every 100 parts by weight of the photosensitive resin composition. If 40 parts by weight or less of the dissolvent is used, viscosity is unnecessarily increased. Accordingly, it is impossible to obtain a smooth surface when coating is performed, a problem arises in the implementation of a desired thickness, uniform mixing when an injection cannot be performed, and physical properties for forming micro patterns are difficult to implement. Meanwhile, if more than 97 parts by weight of the dissolvent is included, adhesiveness with a substrate is reduced, and a uniform coating characteristic and a desired film thickness are difficult to obtain.

The photosensitive resin composition having the above composition according to the present invention is coated on a glass substrate using a common method, such as spin coating, slit spin coating, roll coating, die coating, or curtain coating, and then subjected to exposure and development processes, thereby forming a photosensitive film. In the exposure and development processes, a method of forming photosensitive film using a common photosensitive resin composition is used, but not specially limited.

In the exposure process, a light source radiated from illumination means can include electronic waves, a visible ray from ultraviolet rays, an electron ray, X-rays, and a laser beam. Furthermore, known means, such as a high pressure mercury lamp, a xenon lamp, a carbon arc lamp, a halogen lamp, a cold cathode-ray tube for a duplicator, an LED, and a semiconductor laser, can be used as the irradiation method of the light source.

The development process is performed to form patterns by removing exposed areas from a photosensitive film on which an exposure process has been performed using a developer. Hydroxides of alkali metal or alkali earth metal, carbonates, hydrogen carbonates, or a basic aqueous solution such as NH4+ salt. It is preferred that a developer used in the development process can include an NH4+ aqueous solution, such as a tetramethyl ammonium aqueous solution.

In the entire process, the film is formed by spin-coating the photosensitive resin composition of the present invention on a glass or silicon wafer substrate and performing pre-thermal processing in a temperature range of about 110 to 145° C. for 1 to 2 minutes. After the film is exposed through a photomask in which patterns are formed, the exposed portions are developed using an alkali aqueous solution and washed using deionized water. Thereafter, the patterns are obtained by performing post-thermal processing in a temperature range of about 200 to 350° C. for 30 minutes to 2 hours.

It is preferred that the positive type photosensitive resin composition of the present invention be used in not only the interlayer insulating film, the passivation film, the buffer coating film of a semiconductor device, an insulating film for a multi-layer print substrate, and the insulating film of an OLED display, but also the protection film of a thin film transistor of a liquid crystal display device.

EXAMPLES OF THE INVENTION

Some embodiments of the present invention are described below in more detail. However, the present invention is not limited to the embodiments.

Manufacture of Composition Example 1(3,3',4,4'-diphenyl ether tetracarboxylic acid dichloride)

After anhydrous methyl alcohol of 300 ml was added to 3,3',4,4'-diphenyl ether tetracarboxylic acid dianhydride of 31.0 g (0.1 mole), they were made to react with each other through reflux and agitation at a temperature of 80° C. for 5 hours. Next, the remaining dissolvents were dried under high-temperature and decompression conditions, thereby obtaining 3,3',4,4'-diphenyl ether tetracarboxylic acid dimethylester (37.4 g, yield: 100%). Thionylchloride of 35.4 g (0.3 mole) was dropped into the obtained 3,3',4,4'-diphenyl ether tetracarboxylic acid dimethylester of 37.4 g (0.1 mole). N,N-dimethylformamide was added to the results, and they were made to react with each other at a temperature of 90° C. for 3 hours. Next, the results were cooled at room temperature and the remaining thionylchloride was removed under decompression, thereby obtaining 3,3',4,4'-diphenyl ether tetracarboxylic acid dichloride (41.0 g, yield: 100%).

Embodiment 1

Manufacturing Polymers P-1

The 3,3',4,4'-diphenyl ether tetracarboxylic acid dichloride (24.6 g, 60 mmole) fabricated in the composition example 1 was slowly dropped into N-methyl-2-pyrrolidone of 150 ml in which 2,2-bis(3-amino-4-hydroxyphenyl)-hexafluoropropane (15.4 g, 42 mmole), tributanediol-bis(4-aminobenzoate) (8.50 g, 18 mmole), and pyridine of 10.65 g were dissolved at a temperature of 0° C. under a nitrogen atmosphere. Next, the temperature was slowly raised to the room temperature, and the dissolved results were made to react with each other through agitation for 5 hours. The reaction results were slowly dropped into water of 2 L in order to obtain sediments. The obtained sediments were filtered from the reaction results. The filtered results were washed using water three times and then dried under a decompression condition, thereby obtaining polyamide acid methylester (P-1) of 37.8 g. A weight average molecular weight of the obtained polymers was 31,000.

Embodiment 2

Manufacturing Polymers P-2

Polymers (P-2) were fabricated using the same method as that of the embodiment 1 except that 2,2-bis(3-amino-4-hydroxyphenyl)-hexafluoropropane (13.2 g, 36 mmole) and tributanediol-bis(4-aminobenzoate) (5.7 g, 12 mmole), and 4-oxy dianiline (2.4 g, 12 mmole) were added instead of 2,2-bis(3-amino-4-hydroxyphenyl)-hexafluoropropane (15.4 g, 42 mmole) and tributanediol-bis(4-aminobenzoate) (8.5 g, 18 mmole) used in the embodiment 1. A weight average molecular weight of the obtained polymers was 28,000.

Embodiment 3

Manufacturing Polymers P-3

2,2-bis(3-amino-4-hydroxyphenyl)-hexafluoropropane (11.0 g, 30 mmole), polybutanediol-bis(4-aminobenzoate) (an average molecular weight Mn=12,000, m=13.1) (21.6 g, 18 mmole), and 3,3'-(1,3-phenylenedioxy)dianiline (3.5 g, 12 mmole) were dissolved in N-methyl-2-pyrrolidone of 150 ml. Next, 1,2,3,4-butane tetracarboxylic acid dianhydride (11.9 g, 60 mmole) was slowly added to the dissolved results at a temperature of 0° C., and they were made to react with each other through agitation at room temperature for 8 hours. Pyridine of 7.3 g and acetic anhydride of 17.3 g were added to the reaction results. The reaction temperature was raised to 65° C., and the dissolved results were additionally agitated for 5 hours so that they react with each other. Next, the reaction results were slowly dropped into water of 2 L in order to obtain sediments. The obtained sediments were filtered from the reaction results. The filtered results were washed using water three times and then dried under a decompression condition, thereby obtaining polyimide (P-3) of 38. g. A weight average molecular weight of the obtained polymers was 36,000.

Embodiment 4

Manufacturing Polymers P-4

Polymers (P-4) were fabricated using the same method as that of the embodiment 3 except that 2,2-bis(3-amino-4-hydroxyphenyl)-hexafluoropropane (15.4 g, 42 mmole) and tributanediol-bis(4-aminobenzoate) (11.3 g, 24 mmole) were added instead of 2,2-bis(3-amino-4-hydroxyphenyl)-hexafluoropropane (11.0 g, 30 mmole), polybutanediol-bis (4-aminobenzoate) (an average molecular weight, Mn=12,000, m=13.1) (21.6 g, 18 mmole), and 3,3'-(1,3-phenylenedioxy)dianiline of 3.5 g which were used in the embodiment 3 and 4,4'-(hexafluoroisopropyllidene)diphthalic acid 2anhydride (10 g, 60 mmole) and 5-norbornene acid anhydride (2.0 g, 12 mmole) were added instead of 1,2,3,4-butane tetracarboxylic acid dianhydride (11.9 g, 60 mmole) used in the embodiment 3. A weight molecular weight of the obtained polymers was 25,000.

Embodiment 5

Manufacturing Polymers P-5

3,3',4,4'-diphenyl ether tetracarboxylic acid dichloride (24.6 g, 60 mmole) fabricated in the composition example 1 was slowly dropped into N-methyl-2-pyrrolidone of 150 ml in which 2,2-bis(3-amino-4-hydroxyphenyl)-hexafluoropropane (15.4 g, 42 mmole), 1,2-bis(2-aminoethoxy)ethane (2.7 g, 18 mmole), and pyridine of 10.65 g were dissolved at a temperature of 0° C. under a nitrogen atmosphere. The reaction temperature was slowly raised to the room temperature, and the dissolved results were made to reach with each other through agitation for 5 hours. Next, the reaction results were slowly dropped into water of 2 L in order to obtain sediments. The obtained sediments were filtered. The filtered results were washed using water three times and then dried under a decompression condition, thereby obtaining polyamide acid methylester (P-5) of 32.5 g. A weight average molecular weight of the obtained polymers was 28,000.

Embodiment 6

Manufacturing Polymers P-6

Polymers (P-6) were fabricated using the same method as that of the embodiment 5 except that 2,2-bis(3-amino-4-hydroxyphenyl)-hexafluoropropane (13.2 g, 36 mmole), 1,2-bis (2-aminoethoxy)ethane (1.8 g, 12 mmole), and 4-oxy dianiline (2.4 g, 12 mmole) were added instead of 2,2-bis(3-amino-4-hydroxyphenyl)-hexafluoropropane (15.4 g, 42 mmole) and 1,2-bis(2-aminoethoxy)ethane (2.7 g, 18 mmole) which were used in the embodiment 5. A weight average molecular weight of the obtained polymers (P-6) was 25,000.

Embodiment 7

Manufacturing Polymers P-7

2,2-bis(3-amino-4-hydroxyphenyl)-hexafluoropropane (11.0 g, 30 mmole), 1,2-bis(2-aminoethoxy)ethane (2.7 g, 18 mmole), and 3,3'-(1,3-phenylenedioxy)dianiline (3.5 g, 12 mmole) were dissolved in N-methyl-2-pyrrolidone of 150 ml. 1,2,3,4-butane tetracarboxylic acid 2 anhydride (11.9 g, 60 mmole) was slowly added to the dissolved results at a temperature of 0° C., and they were made to reach with each other through agitation at room temperature for 8 hours. Pyridine of 7.3 g and acetic acid anhydride of 17.3 g were added to the reaction results. The reaction temperature was raised to 65° C. Next, the dissolved results were additionally agitated for 5 hours and made to react with each other. The reaction results were slowly dropped into water of 2 L in order to obtain sediments. The obtained sediments were filtered from the reaction results. The filtered results were washed using water three times and then dried under a decompression condition, thereby obtaining polyimide (P-7) of 24.8 g. A weight average molecular weight of the obtained polymers was 24,000.

Embodiment 8

Manufacturing Polymers P-8

Polymers (P-8) were fabricated using the same method as that of the embodiment 3 except that 2,2-bis(3-amino-4-hydroxyphenyl)-hexafluoropropane (15.4 g, 42 mmole) and bis (2-(2-aminoethoxy)ethyl)ether (4.6 g, 24 mmole) were added instead of 2,2-bis(3-amino-4-hydroxyphenyl)-hexafluoropropane (11.0 g, 30 mmole), 1,2-bis(2-aminoethoxy)ethane (2.7 g, 18 mmole), and 3,3'-(1,3-phenylenedioxy)dianiline of 3.5 g which were used in the embodiment 3 and 4,4'-(hexafluoroisopropyllidene)diphthalic acid 2anhydride (10 g, 60 mmole) and 5-norbornene acid anhydride (2.0 g, 12 mmole) were added instead of 1,2,3,4-butane tetracarboxylic acid 2 anhydride (11.9 g, 60 mmole) used in the embodiment 3. A weight molecular weight of the obtained polymers was 31,000.

Comparison Example 1

Manufacturing Polymers R-5

Polyamide acid methylester (R-5) of 29.5 g was fabricated using the same method as that of the embodiment 1 except that 2,2-bis(3-amino-4-hydroxyphenyl)-hexafluoropropane (22.0 g, 60 mmole) was used in the whole quantity instead of 2,2-bis(3-amino-4-hydroxyphenyl)-hexafluoropropane (15.4 g, 42 mmole) and tributanediol-bis(4-aminobenzoate) (8.50 g, 18 mmole) which were used in the embodiment 1. A weight average molecular weight of the obtained polymers was 29,500.

Comparison Example 2

Manufacturing Polymers R-6

Polyimide (R-6) was fabricated using the same method as that of the embodiment 4 except that 2,2-bis(3-amino-4-hydroxyphenyl)-hexafluoropropane (24.2 g, 66 mmole) was used in the whole quantity instead of 2,2-bis(3-amino-4-hydroxyphenyl)-hexafluoropropane (15.4 g, 42 mmole) and tributanediol-bis(4-aminobenzoate) (11.3 g, 24 mmole) which were used in the embodiment 4. A weight average molecular weight of the obtained polymers was 23,000.

Comparison Example 3

Manufacturing Polymers R-7

Polyamide acid methylester (R-7) of 29.5 g was fabricated using the same method as that of the embodiment 5 except that 2,2-bis(3-amino-4-hydroxyphenyl)-hexafluoropropane (22.0 g, 60 mmole) was used in the whole quantity instead of 2,2-bis(3-amino-4-hydroxyphenyl)-hexafluoropropane (15.4 g, 42 mmole) and 1,2-bis(2-aminoethoxy)ethane (2.7 g, 18 mmole) which were used in the embodiment 5. A weight average molecular weight of the obtained polymers was 29,500.

Comparison Example 4

Manufacturing Polymers R-8

Polyimide (R-8) was fabricated using the same method as that of the embodiment 8 except that 2,2-bis(3-amino-4-hydroxyphenyl)-hexafluoropropane (22.0 g, 60 mmole) was used in the whole quantity instead of 2,2-bis(3-amino-4-hydroxyphenyl)-hexafluoropropane (15.4 g, 42 mmole) and bis (2-(2-aminoethoxy)ethyl)ether (4.6 g, 24 mmole) which were used in the embodiment 8. A weight average molecular weight of the obtained polymers was 23,000.

Manufacturing of Photosensitive Resin Composition and Evaluation of Characteristics The obtained polyimide precursor or polyimide of 3 g and 4,4'-[1-[4-[1-(4-hydroxyphenyl)-1-methylethyl]phenyl]ethyllidene]bis[phenol]diazonaphtho quinone sulfonate (TPPA320) of 450 mg (i.e., a photoactive compound) were added to γ-butyrolactoneketone of 6.53 g. The added results were agitated at room temperature for 1 hour and were filtered using a filter having holes of 1 μm formed therein, thereby fabricating a photosensitive resin composition.

1. Evaluation of Photosensitivity

The fabricated photosensitive resin composition was coated on a 4-inch silicon wafer using a spin coating method and then dried at a temperature of 120° C. for 2 minutes, thereby forming a film of 10 μm in thickness. The silicon wafer was exposed to energy of 200 to 600 mJ/cm² through a mask having micro patterns formed therein in an i-line stepper exposure apparatus. Next, the exposed silicon wafer was developed using a tetramethyl ammonium hydration aqueous solution of 2.38 weight % for 90 seconds, washed using pure water, and then dried under a nitrogen atmosphere, thereby obtaining a polymer film having patterns formed therein. The coating property and photosensitivity of the obtained polymer film were evaluated by measuring a surface roughness, a coating failure characteristic, energy ($E_{th}$) necessary to implement the micro square patterns of 5×5 μm, and the shape of the patterns. The evaluation results are listed in Table 1 below.

2. Evaluation of Polymer Film Characteristics

The photosensitive resin composition was coated on a glass substrate using a spin coating method and subjected to heat treatment under a nitrogen atmosphere at a temperature of 320° C. for 1 hour, thereby forming a polyimide film of 10 μm in thickness. Whether film failures, such as cracks, exist in the formed polymer film was checked using a microscope and through the naked eye. The formed polymer film was peeled off from the glass substrate by performing a Pressure Cooking Treatment (PCT) process at a temperature of 125° C. under a pressure of 2.3 atm for 30 minutes in an autoclave. The peeled polyimide film was cut into samples each having a width of 1 cm and a length of 8 cm. Polymer film characteristics, such as elongation, for the cut samples were measured, and the measurement results are listed in Table 1 below.

TABLE 1

| | Coating property | $E_{th}$ (mJ/cm²) | Crack characteristic | Elongation (%) | Tension strength (Mpa) |
|---|---|---|---|---|---|
| Embodiment 1 | excellent | 300 | no crack | 30 | 120 |
| Embodiment 2 | excellent | 350 | no crack | 20 | 127 |
| Embodiment 3 | excellent | 280 | no crack | 40 | 117 |
| Embodiment 4 | excellent | 250 | no crack | 35 | 128 |
| Embodiment 5 | excellent | 310 | no crack | 20 | 128 |
| Embodiment 6 | excellent | 360 | no crack | 30 | 125 |
| Embodiment 7 | excellent | 250 | no crack | 30 | 118 |
| Embodiment 8 | excellent | 280 | no crack | 30 | 130 |
| Comparison example 1 | excellent | 430 | micro cracks generated | 10 | 115 |
| Comparison example 2 | excellent | 470 | serious crack | impossible measurement | impossible measurement |
| Comparison example 3 | excellent | 430 | micro cracks generated | 10 | 115 |
| Comparison example 4 | excellent | 470 | serious crack | impossible measurement | impossible measurement |

The photosensitive resin composition including the polyimide or precursor thereof according to the present invention had excellent photosensitivity as compared with the comparison examples. The polymer film formed using the same method as that of the photosensitive resin composition had no crack and improved elongation and tension strength characteristics.

The characteristics are very important in terms of reliability or durability when photosensitive polyimide is used for the protection film or the insulating film of devices, such as semiconductors or OLED devices. Accordingly, the photosensitive polyimide composition according to the present invention meets the above requirements.

The invention claimed is:

1. A polyimide or precursor thereof represented by:

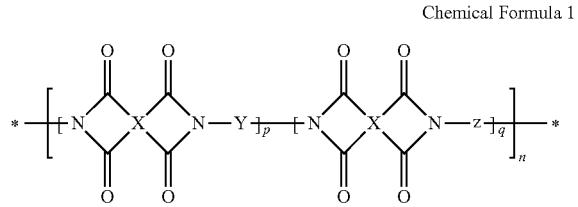

Chemical Formula 1

-continued

Chemical Formula 2

$$*{-}[{-}\underset{H}{N}{-}\underset{\underset{OR}{|}}{X}{-}\underset{H}{N}{-}Y{-}]_p{-}[{-}\underset{H}{N}{-}\underset{\underset{OR}{|}}{X}{-}\underset{H}{N}{-}Z{-}]_q{-}]_n*$$

wherein,
X is a 4-valence organic group,
Y is a 2-valence organic group,
0<p<1, 0<q<1, and p+q=1,
n is an integer of 2 to 500,
R is hydrogen or an alkyl group having 1 to 8 carbon atoms, and
Z is derived from a diamine chemical compound represented by:

Chemical Formula 3

$$H_2N{-}(R_1)_l{-}(C(O))_m{-}(OR_2)_{n'}{-}O{-}(C(O))_m{-}(R_1)_l{-}NH_2$$

wherein $R_1$ is an alkylene group having 2 to 8 carbon atoms or an arylene group having 6 to 8 carbon atoms, $R_2$ is an alkylene group having 2 to 8 carbon atoms, l is 0 or 1, m is 0 or 1, and n' is an integer of 1 to 21.

2. The polyimide or precursor thereof according to claim 1, wherein n' in Chemical Formula 3 is an integer of 2 to 15.

3. The polyimide or precursor thereof according to claim 1, wherein X in Chemical Formula I is at least one organic group selected from the group consisting of:

4. The polyimide or precursor thereof according to claim 1, wherein Y in Chemical Formula 1 is at least one organic group selected from the group consisting of:

-continued

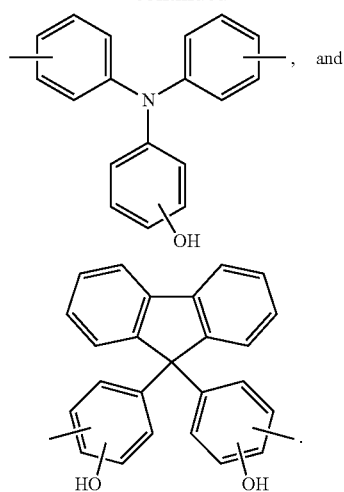

5. The polyimide or precursor thereof according to claim 1, wherein Y in Chemical Formula 1 is an organic group derived from at least one organic group compound selected from the group consisting of:

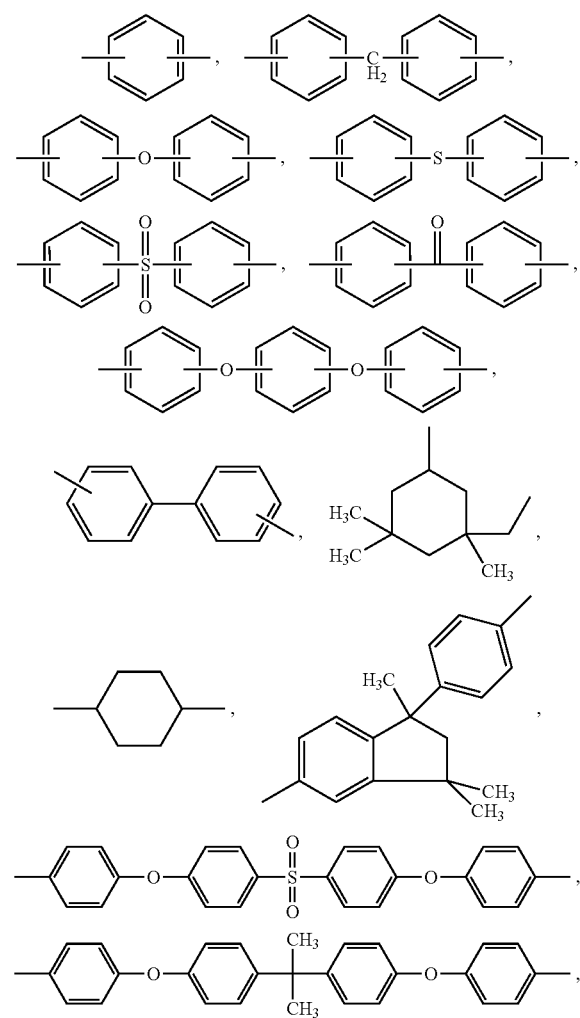

-continued

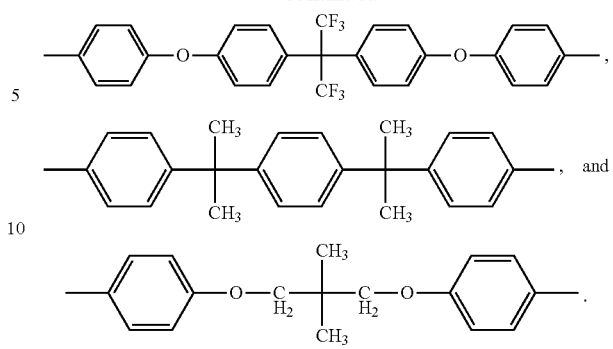

6. A photosensitive resin composition comprising the polyimide or precursor thereof according to claim 1 and a photoactive compound.

7. The photosensitive resin composition according to claim 6, wherein the photoactive compound is present in the amount of 1 to 50 parts by weight for every 100 parts by weight of the polyimide or precursor thereof.

8. The photosensitive resin composition according to claim 6, wherein the photoactive compound is at least one chemical compound selected from the group consisting of:

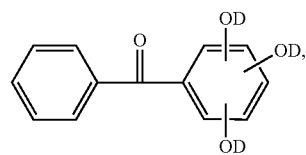

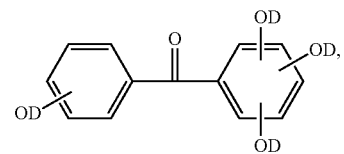

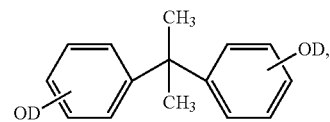

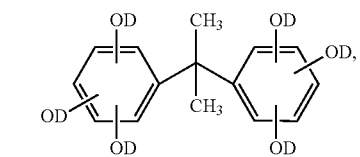

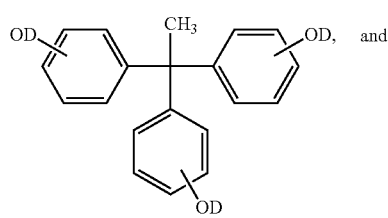

-continued

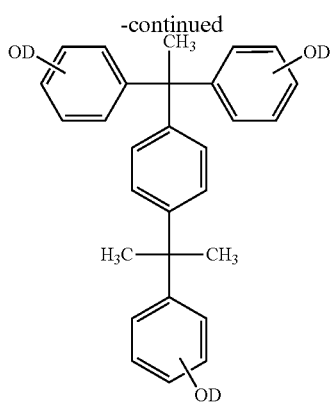

wherein D is at least one of the following organic groups:

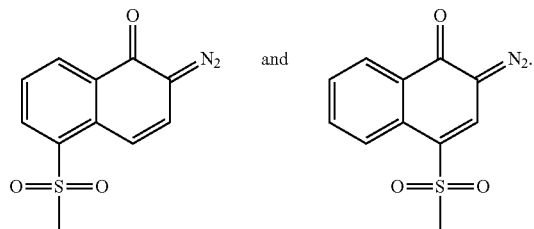

9. The photosensitive resin composition according to claim 6, further comprising 0.1 to 30 parts by weight of one or more additives selected from the group consisting of a dissolution rate regulator, a promoter, an adhesive enhancer, and a surface active agent, for every 100 parts by weight of the polyimide or precursor thereof.

10. The photosensitive resin composition according to claim 6, further comprising at least one dissolvent, wherein the dissolvent is contained in the amount of 40 to 97 parts by weight for every 100 parts by weight of the photosensitive resin composition; and wherein the dissolvent is selected from the group consisting of N-methyl-2-pyrrolidone, N,N-dimethylformamide, N,N-dimethylacetamide, dimethylsulphoxide, N,N-diethylacetamide, γ-butyrolactoneketone, γ-valerolactoneketone, m-cresol, ethyleneglycol monomethylether, ethyleneglycol monomethylether acetate, ethyleneglycol monoethylether, ethyleneglycol monoethylether acetate, ethyleneglycol monobutylether, ethyleneglycol monobutylether acetate, propyleneglycol monomethylether, propyleneglycol monomethylether acetate, propyleneglycol monoethylether, propyleneglycol monoethylether acetate, propyleneglycol monopropylether, propyleneglycol monopropylether acetate, propyleneglycol monobutylether, propyleneglycol monobutylether acetate, propyleneglycol dimethylether, propyleneglycol diethylether, propyleneglycol dipropyltylether, propyleneglycol dibutylether, lactic acid ethyl, lactic add butyl, cyclohezanones, and cyclopentanone.

* * * * *